(12) United States Patent
Huang

(10) Patent No.: US 11,387,207 B2
(45) Date of Patent: Jul. 12, 2022

(54) METHOD FOR FABRICATING SEMICONDUCTOR DEVICE INCLUDING ETCHING AN EDGE PORTION OF A BONDING LAYER BY USING AN ETCHING MASK

(71) Applicant: NANYA TECHNOLOGY CORPORATION, New Taipei (TW)

(72) Inventor: Sheng-Fu Huang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/096,975

(22) Filed: Nov. 13, 2020

(65) Prior Publication Data

US 2022/0157761 A1    May 19, 2022

(51) Int. Cl.
*H01L 23/48* (2006.01)
*H01L 23/00* (2006.01)
*H01L 21/48* (2006.01)

(52) U.S. Cl.
CPC .......... *H01L 24/27* (2013.01); *H01L 21/4814* (2013.01); *H01L 23/481* (2013.01); *H01L 24/83* (2013.01); *H01L 2224/2747* (2013.01)

(58) Field of Classification Search
CPC ... H01L 21/4814; H01L 23/481; H01L 24/27; H01L 24/83; H01L 2224/2747; H01L 21/187; H01L 2224/80895; H01L 2224/80896; H01L 2224/83894; H01L 2224/83895
USPC .......................................... 257/455; 438/455
See application file for complete search history.

(56) References Cited

U.S. PATENT DOCUMENTS

| | | | | |
|---|---|---|---|---|
| 7,214,605 | B2 * | 5/2007 | Ramanathan | H01L 24/11 257/E21.508 |
| 10,854,530 | B1 * | 12/2020 | Cheng | H01L 23/481 |
| 2004/0014308 | A1 * | 1/2004 | Kellar | H01L 25/50 438/612 |
| 2005/0176174 | A1 * | 8/2005 | Leedy | H01L 21/762 438/107 |
| 2014/0295582 | A1 * | 10/2014 | Chen | H01L 21/28 438/14 |
| 2020/0381379 | A1 * | 12/2020 | Chen | H01L 24/06 |
| 2021/0104482 | A1 * | 4/2021 | Hong | H01L 24/14 |

* cited by examiner

*Primary Examiner* — Khiem D Nguyen
(74) *Attorney, Agent, or Firm* — CKC & Partners Co., LLC

(57) ABSTRACT

A method for fabricating a semiconductor device includes: forming a first bonding layer on a first wafer and an etching mask on the first bonding layer; etching an edge portion of the first bonding layer by using the etching mask, such that a portion of the first wafer is exposed; removing the etching mask; and bonding a second wafer to the first bonding layer.

8 Claims, 3 Drawing Sheets

METHOD FOR FABRICATING SEMICONDUCTOR DEVICE INCLUDING ETCHING AN EDGE PORTION OF A BONDING LAYER BY USING AN ETCHING MASK

BACKGROUND

The present invention relates to a method for fabricating a semiconductor device.

DESCRIPTION OF RELATED ART

Currently, the three-dimensional integrated circuit (3D-IC) components are widely developed in semiconductor packaging in which multiple semiconductor dies are stacked upon one another, such as package-on-package (PoP) and system-in-package (SiP) packaging techniques. Some of the benefits of 3D-IC components, for example, include exhibiting a smaller footprint, reducing power consumption by reducing the lengths of signal interconnects, and improving yield and fabrication cost. As semiconductor technologies further advance, bonding technology for chip-to-wafer bonding or wafer-to-wafer bonding is utilized in fabrication of 3D-IC components. For example, in wafer-to-wafer bonding technology, various methods have been developed to bond two package components (such as wafers) together. Hybrid bonding is one type of bonding technology for 3D-ICs, where two semiconductor wafers are bonded together using a hybrid bonding technique.

SUMMARY

The invention provides a method for fabricating a semiconductor device includes: forming a first bonding layer on a first wafer and an etching mask on the first bonding layer; etching an edge portion of the first bonding layer by using the etching mask, such that a portion of the first wafer is exposed; removing the etching mask; and bonding a second wafer to the first bonding layer.

In some embodiments of the present invention, the method further includes: forming an integrated circuit structure on the first wafer in which the integrated circuit structure is located between the first wafer and the first bonding layer.

In some embodiments of the present invention, the integrated structure includes a substrate and a via passing through the substrate.

In some embodiments of the present invention, the via is in contact with a first conductive feature of the bonding layer.

In some embodiments of the present invention, the via has a width smaller than a width of the first conductive feature.

In some embodiments of the present invention, the first bonding layer includes a first dielectric layer and a first conductive feature extending through the first dielectric layer.

In some embodiments of the present invention, forming the etching mask includes: forming a photoresist layer on the first bonding layer; and performing an edge trimming process to remove an edge portion of the photoresist layer.

In some embodiments of the present invention, bonding the second wafer to the first bonding layer includes: contacting the first bonding layer with a second bonding layer over the second wafer; and combining the first and second bonding layers.

In some embodiments of the present invention, a first conductive feature of the first bonding layer is in contact with a second conductive feature of the second bonding layer.

In some embodiments of the present invention, the first conductive feature has a width equal to a width of the second conductive feature.

In summary, the etching mask is not only used to partially etch the first bonding layer as well as the first wafer but also protect the bonding layer, such that the bonding layer's surface smooth. As such, the first wafer and the bonding layer can gain well bonding for a wafer-to-wafer bonding process.

It is to be understood that both the foregoing general description and the following detailed description are by examples, and are intended to provide further explanation of the invention as claimed.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
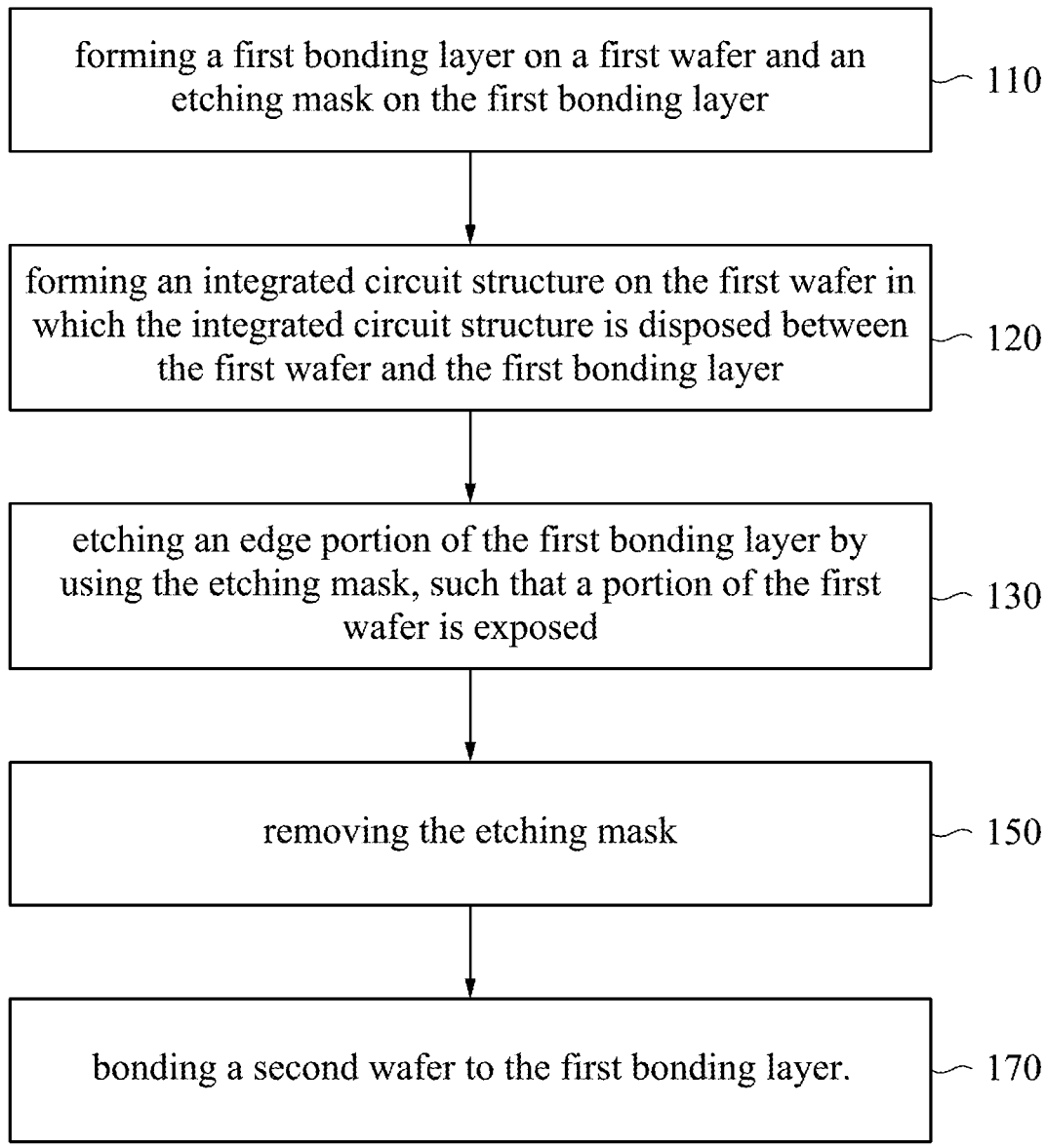
FIG. 1 is a flowchart of a method for fabricating a semiconductor device in accordance with some embodiments of the present invention.

The following disclosure provides many different embodiments, or examples, for implementing different features of the provided subject matter. Specific examples of components and arrangements are described below to simplify the present invention. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present invention may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Reference is made to FIG. 1. FIG. 1 is a flowchart of a method 100 for fabricating a semiconductor device in accordance with some embodiments of the present invention. The method 100 begins with Step 110 in which a first bonding layer is formed on a first wafer and an etching mask is formed on the first bonding layer. The method 100 continues with Step 130 in which an edge portion of the first bonding layer is etched by using the etching mask, such that a portion of the first wafer is exposed. Thereafter, the method 100 continues with Step 150 in which the etching mask is removed. The method 100 continues with Step 170 in which a second wafer is bonded to the first bonding layer.

Figure 2:
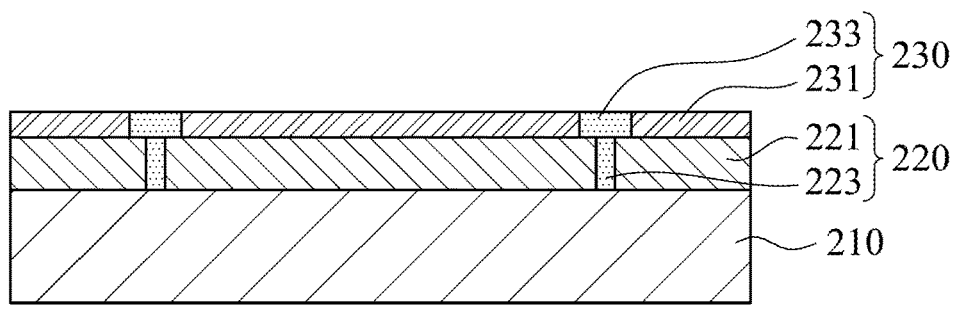
FIGS. 2-7 are cross-sectional views of intermediate stages of a method for fabricating a semiconductor device in accordance with some embodiments of the present invention.
Figure 3:
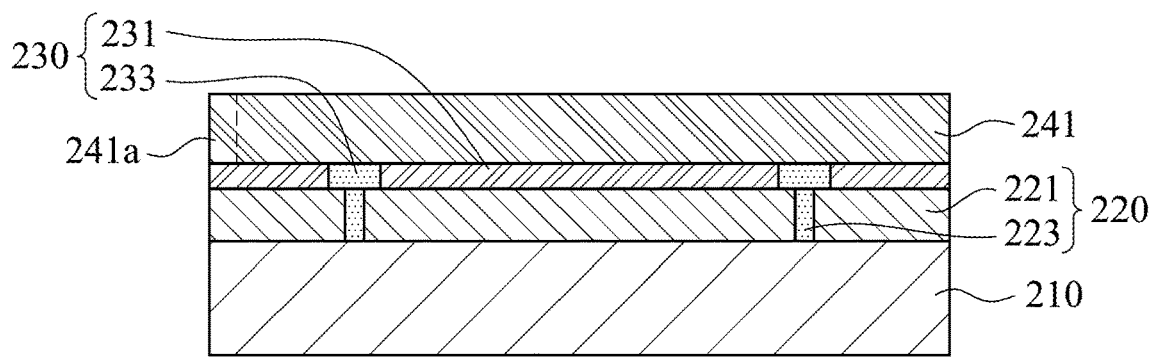
Figure 4:
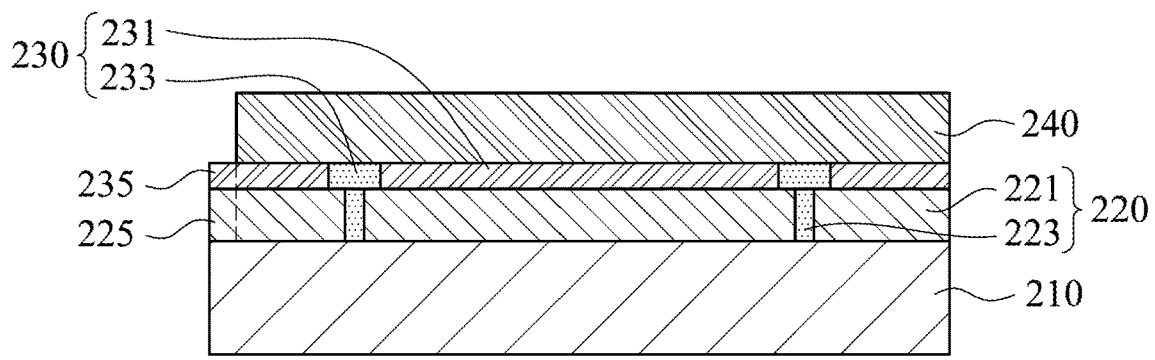

FIGS. 2-7 are cross-sectional views of intermediate stages of the method 100 for fabricating a semiconductor device 200 in accordance with some embodiments of the present invention. FIGS. 2-4 diagrammatically illustrate the details about Step 110 in FIG. 1. Reference is made to FIGS. 2-4, a first bonding layer 230 is formed on a first wafer 210 and an etching mask 240 is formed on the first bonding layer 230, such that the first bonding layer 230 is disposed between the first wafer and the etching mask 240. Specifically, the first wafer 210 may be a semiconductor substrate, such as a bulk semiconductor or the like, which may be doped (e.g., with a p-type or an n-type dopant) or undoped. In some embodiments of the present disclosure, the first wafer 210 may be a silicon wafer, and other suitable substrates, such as a multi-layered substrate (e.g., a semiconductor-on-insulator (SOI) substrate), a gradient substrate, or the like, may also be used. The semiconductor material of the first wafer 210 may include silicon, germanium, a compound semiconductor (e.g., silicon carbide, gallium arsenic, gallium phosphide, indium phosphide, indium arsenide, etc.), an alloy semiconductor, or combinations thereof. A wide variety of electrical components (e.g., transistors, capacitors, resistors, combinations of these, and the like) may be used to generate the structural and functional requirements of the design for the first wafer 210. In some embodiments, the first wafer 210 is free of through semiconductor vias depending on the design requirements. In alternative embodiments, through semiconductor vias are formed in the first wafer 210.

In some embodiments of the present invention, the first bonding layer 230 may include a first dielectric layer 231 and a plurality of first conductive features 233 extending through the first dielectric layer 231, in which the first conductive features 233 are wrapped by the first dielectric layer 231. The first dielectric layer 231 which includes a dielectric material such as silicon oxide can be formed by spin-coating, laminating, or other suitable deposition techniques, and then the dielectric material is patterned to form the first dielectric layer 231 having a plurality of openings (not shown) using, for example, lithography and etching processes, or other suitable methods. Subsequently, a conductive material may be formed in the openings of the first dielectric layer 231 so as to form the first conductive features 233, and the first conductive features 233 can be formed by plating, sputtering, chemical vapor deposition (CVD), plasma-enhanced chemical vapor deposition (PECVD), atomic layer deposition (ALD), or other suitable depositing process. The present invention is not limited in this respect.

In some embodiments of the present invention, forming the etching mask 240 includes: forming a photoresist layer 241 on the first bonding layer 230; and performing an edge trimming process to remove an edge portion 241a of the photoresist layer 241. Specifically, the edge portion 241a can include an edge bead. The edge trimming process may include wafer edge exposure (WEE) process or an edge bead removal (EBR) process, such as an optical EBR process or a chemical EBR process which includes applying a propylene glycol methyl ether acetate (PGMEA) solvent or an ethyleneglycol monomethyl ether acetate (EGMEA) solvent to the photoresist layer 241. The etching mask 240 can be a non-patterned mask, but the present invention is not limited in this respect.

In some embodiments of the present invention, the method 100 further includes Step 120 conducted before Step 130, in which an integrated circuit structure 220 is formed on the first wafer 210, and the integrated circuit structure 220 is located between the first wafer 210 and the first bonding layer 230. Specifically, the integrated circuit structure 220 may include logic dies (e.g., central processing unit (CPU), graphics processing unit (GPU), microcontroller, etc.), memory dies (e.g., dynamic random access memory (DRAM) dies, static random access memory (SRAM) dies, etc.), power management dies (e.g., power management integrated circuit (PMIC) dies), radio frequency (RF) dies, sensor dies, micro-electro-mechanical-system (MEMS) dies, the like, or a combination thereof. In certain embodiments, the processing, memory, and/or electronic control functionality may be integrated on the same integrated circuit structure 220. In some embodiments of the present invention, the integrated circuit structure 220 includes a semiconductor substrate 221 and through semiconductor vias 223 extending through the semiconductor substrate 221. The present invention is not limited in this respect.

In some embodiments of the present invention, an interconnection structure can be formed between the first wafer 210 and the integrated circuit structure 220. The semiconductor vias in the first wafer 210 can be electrically connected to the through semiconductor vias 223 of the integrated circuit structure 220 through the interconnection structure.

In some embodiments of the present invention, the through semiconductor vias 223 are electrically connected to the first conductive features 233 of the first bonding layer 230, respectively. For instance, the through semiconductor vias 223 are respectively in contact with the first conductive features 233 of the first bonding layer 230. The present invention is not limited in this respect.

In some embodiments of the present invention, each of the through semiconductor vias 223 has a width smaller than a width of each first conductive feature 233 of first bonding layer 230. In alternative embodiments of the present invention, each of the through semiconductor vias 223 has a width greater than a width of each first conductive feature 233. The present invention is not limited in this respect.

Figure 5:
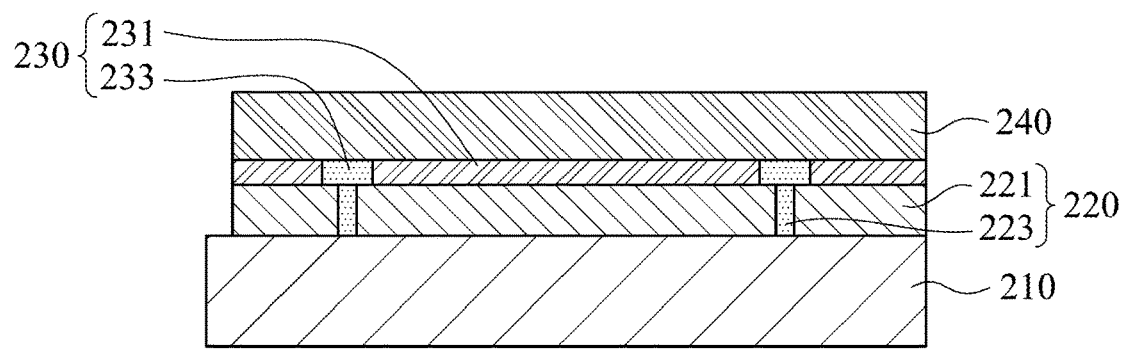

Reference is made to FIGS. 4 and 5. FIGS. 4 and 5 diagrammatically illustrate Step 130 in FIG. 1, and an edge portion 225 of the integrated circuit structure 220 as well as an edge portion 235 of the first bonding layer 230 are etched and removed by using the etching mask 240, such that a portion of the first wafer 210 is exposed. In some embodiments of the present invention, the edge portions 225, 235 are etched by an anisotropic etch process such as a dry etch process. In some embodiments, the dry etch process is a reactive ion etch (RIE) process, a plasma etch process, or any suitable etch process may be utilized. The present invention is not limited in this respect. In this case, the etching mask 240 can at least protect the first bonding layer 230 from being contaminated by the anisotropic etch process. Therefore, the bonding layer 230 has a smooth surface, which means few defects are formed on the first bonding layer 230.

Figure 6:
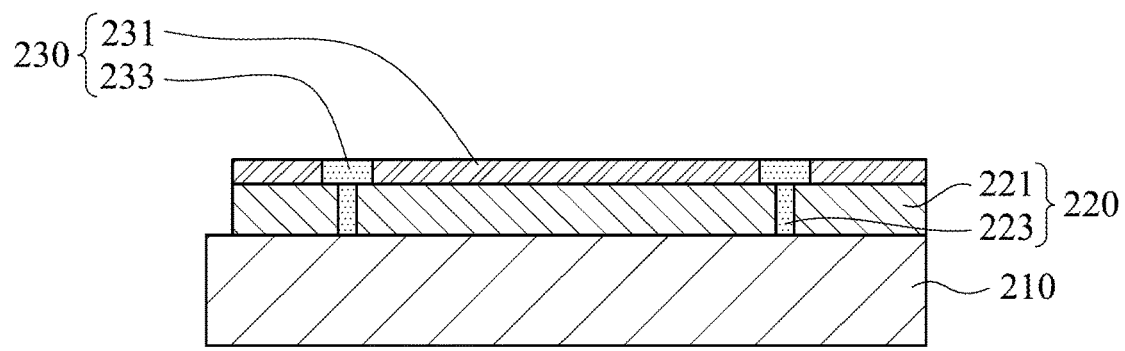

Reference is made to FIGS. 5 and 6. FIGS. 5 and 6 diagrammatically illustrate Step 150 in FIG. 1, in which the etching mask 240 is removed. Specifically, a planarization process with end point detection is performed to remove the etching mask 240, and the planarization process can include a mechanical grinding process and/or a chemical mechanical polishing (CMP) process, or any other applicable processes. The present invention is not limited in this respect.

Figure 7:
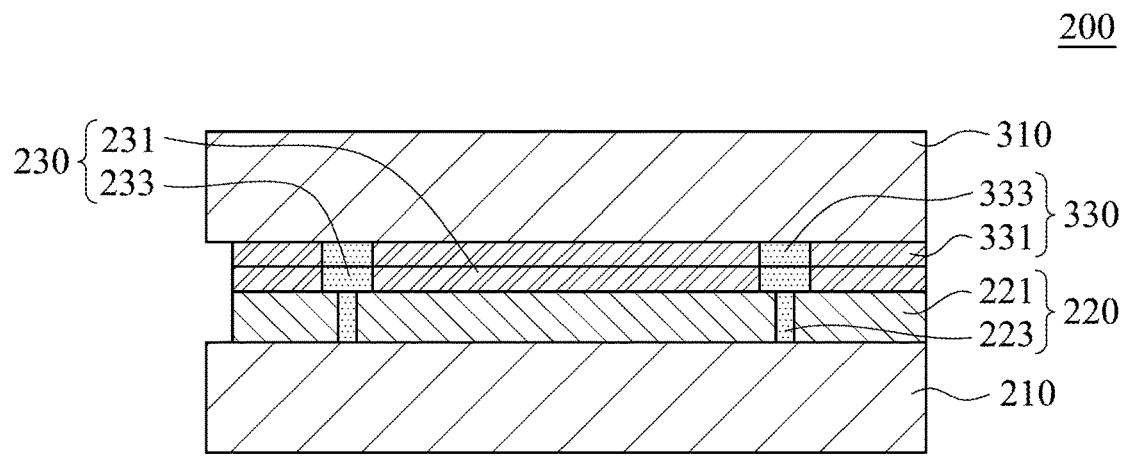

Reference is made to FIGS. 6 and 7. FIGS. 6 and 7 diagrammatically illustrate Step 170 in FIG. 1, in which a second wafer 310 is bonded to the first bonding layer 230, such that the first and second wafers 210, 310 are bonded to form a semiconductor device 200. The second wafer 310 may be a silicon wafer, a semiconductor substrate (e.g., a bulk semiconductor which may be doped or undoped), or other suitable substrates (e.g., a multi-layered, gradient substrate, etc.). In some embodiments of the present invention, Step 170 further includes: contacting the first bonding layer 230 with a second bonding layer 330 over the second wafer 310; and combining the first and second bonding layers 230, 330. The first and second bonding layers 230, 330 can be combined by using hybrid bonding process, fusion bonding process, direct bonding process, dielectric bonding process, metal bonding process, solder joints process, or other applicable techniques. Specifically, pressure is applied to the first wafer 210 and the second wafer 310 to form a bond therebetween, thus the first conductive features 233 of the first bonding layer 230 are in contact with second conductive features 333 of the second bonding layer 330, respectively. For example, after the first dielectric layer 231 and a second dielectric layer 331 of the second bonding layer 330 are bonded with a dielectric-to-dielectric bond, the first conductive features 233 are bonded with the second conductive features 333 of the second wafer 310 with a metal-to-metal bond. In some embodiments of the present invention, each of the first conductive features 233 has a width equal to a width of the corresponding second conductive feature 333. The present invention is not limited in this respect.

In summary, the etching mask is not only used to partially etch the first bonding layer as well as the first wafer but also protect the bonding layer, such that the bonding layer's surface smooth. As such, the first wafer and the bonding layer can gain well bonding for a wafer-to-wafer bonding process.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for fabricating a semiconductor device comprising:
   forming a first bonding layer on a first wafer and an etching mask on the first bonding layer, wherein the first bonding layer comprises a first dielectric layer and a first conductive feature extending through the first dielectric layer;
   etching an edge portion of the first bonding layer by using the etching mask, such that a portion of the first wafer is exposed;
   removing the etching mask; and
   bonding a second wafer to the first bonding layer, wherein bonding the second wafer to the first bonding layer comprises:
   enabling the first dielectric layer to be in physical contact with a second dielectric layer of a second bonding layer over the second wafer; and
   enabling the first conductive feature to be in physical contact with a second conductive feature of the second bonding layer, the second conductive feature extending through the second dielectric layer.

2. The method of claim 1 further comprising:
   forming an integrated circuit structure on the first wafer, wherein the integrated circuit structure is disposed between the first wafer and the first bonding layer.

3. The method of claim 2, wherein the integrated circuit structure comprises a substrate and a via passing through the substrate.

4. The method of claim 3, wherein the via is in contact with the first conductive feature of the first bonding layer.

5. The method of claim 4, wherein the via has a width smaller than a width of the first conductive feature.

6. The method of claim 1, wherein forming the etching mask comprises:
   forming a photoresist layer on the first bonding layer; and
   performing an edge trimming process to remove an edge portion of the photoresist layer.

7. The method of claim 1, wherein bonding the second wafer to the first bonding layer further comprises:
   combining the first and second bonding layers.

8. The method of claim 1, wherein the first conductive feature has a width equal to a width of the second conductive feature.

* * * * *